United States Patent
Luo et al.

(10) Patent No.: US 9,479,190 B2
(45) Date of Patent: Oct. 25, 2016

(54) SUCCESSIVE APPROXIMATION REGISTER-BASED ANALOG-TO-DIGITAL CONVERTER WITH INCREASED TIME FRAME FOR DIGITAL-TO-ANALOG CAPACITOR SETTLING

(71) Applicant: Lattice Semiconductor Corporation, Portland, OR (US)

(72) Inventors: Kexin Luo, Shanghai (CN); Xiaozhi Lin, Shanghai (CN); Guofu Peng, Shanghai (CN); Yu Shen, Shanghai (CN); Gijung Ahn, Sunnyvale, CA (US)

(73) Assignee: Lattice Semiconductor Corporation, Portland, OR (US)

( * ) Notice: Subject to any disclaimer, the term of this patent is extended or adjusted under 35 U.S.C. 154(b) by 70 days.

(21) Appl. No.: 14/423,681

(22) PCT Filed: Oct. 23, 2014

(86) PCT No.: PCT/CN2014/089275
§ 371 (c)(1),
(2) Date: Feb. 24, 2015

(87) PCT Pub. No.: WO2016/061784
PCT Pub. Date: Apr. 28, 2016

(65) Prior Publication Data
US 2016/0254821 A1    Sep. 1, 2016

(51) Int. Cl.
*H03M 1/12* (2006.01)
*H03M 1/46* (2006.01)
*H03K 5/24* (2006.01)

(52) U.S. Cl.
CPC ........... *H03M 1/466* (2013.01); *H03K 5/2481* (2013.01)

(58) Field of Classification Search
CPC ...... H03M 1/125; H03M 1/462; H03M 1/12; H03M 1/46; H03M 1/468; H03M 1/38; H03M 1/00; H03M 1/466; H03M 1/144; H03M 1/804; H03M 3/458
USPC .................. 341/118, 128, 122, 155, 161, 172
See application file for complete search history.

(56) References Cited

U.S. PATENT DOCUMENTS 8,659,463 B2    2/2014  Cho et al.
8,786,483 B1 *  7/2014  Thompson .......... H03M 1/0836
                                              341/120

(Continued)

FOREIGN PATENT DOCUMENTS

CN    101662283 A    3/2010
CN    101764612 A    6/2010

(Continued)

OTHER PUBLICATIONS

Liu, C.-C. et al., "A 10-bit 50-MS/s SAR ADC with a Monotonic Capacitor Switching Procedure," IEEE Journal of Solid-State Circuits, Apr. 2010, pp. 731-740, vol. 45, No. 4.

(Continued)

*Primary Examiner* — Linh Nguyen
(74) *Attorney, Agent, or Firm* — Fenwick & West LLP

(57) ABSTRACT

Embodiments relate to successive approximation register (SAR)-based analog-to-digital converters (ADCs) that increase a time frame allocated for the settling of capacitors in a digital-to-analog converter (DAC) capacitor network by feeding a comparator output signal to the DAC to begin DAC capacitor settling before the comparator output is latched by a clock signal at a latching time. The SAR ADC can include a window circuit that provides the comparator output directly from the comparator to the DAC before the latching time of the comparator. After the latching time, the latched version of the comparator output is provided to the DAC capacitor. By providing the capacitor output to the DAC capacitor before latching, DAC capacitor can settle earlier compared to an SAR ADC where DAC capacitor settling begins after the latching time of the comparator.

20 Claims, 11 Drawing Sheets

(56) References Cited

U.S. PATENT DOCUMENTS

| | | | |
|---|---|---|---|
| 8,866,662 B1* | 10/2014 | Naumov | H03M 1/62 341/155 |
| 8,957,802 B1* | 2/2015 | Evans | H03M 1/0863 341/155 |
| 2005/0225471 A1 | 10/2005 | Yukawa | |
| 2011/0063147 A1* | 3/2011 | Yoshioka | H03M 1/462 341/118 |
| 2013/0009796 A1* | 1/2013 | Sakiyama | H03M 1/0624 341/110 |
| 2013/0093609 A1* | 4/2013 | Chang | H03M 1/462 341/110 |
| 2014/0022105 A1* | 1/2014 | Chen | H03M 1/38 341/161 |

FOREIGN PATENT DOCUMENTS

| | | |
|---|---|---|
| CN | 102158231 A | 8/2011 |
| CN | 102355266 A | 2/2012 |

OTHER PUBLICATIONS

Liu, C.-C. et al., "A 0.92mW 10-bit 50-MS/s SAR ADC in 0.13μm CMOS Process," 2009 Symposium on VLSI Circuits Digest of Technical Papers, 2009, pp. 236-237.

Liu, C.-C. et al., "A 10b 100MS/s 1.13mW SAR ADC with Binary-Scaled Error Compensation," ISSCC 2010, Session 21, 2010 IEEE International Solid-State Circuits Conference, Feb. 10, 2010, pp. 386-387 and continuation page.

PCT International Search Report and Written Opinion, PCT Application No. PCT/CN2014/089275, Mar. 27, 2015, 12 pages.

* cited by examiner

SUCCESSIVE APPROXIMATION REGISTER-BASED ANALOG-TO-DIGITAL CONVERTER WITH INCREASED TIME FRAME FOR DIGITAL-TO-ANALOG CAPACITOR SETTLING

BACKGROUND

1. Field of the Disclosure

This disclosure pertains to analog-to-digital converters (ADCs) and specifically to successive approximation register (SAR)-based ADCs.

2. Description of the Related Art

Successive approximation register (SAR)-based analog-to-digital converters (ADCs) SAR ADCs require several comparison cycles to complete conversion of one sampled analog signal to a digital value, and therefore have limited operational speed. Due to low power consumption, SAR architectures are extensively used in low-power and low-speed applications with a sampling frequency of less than several MSamples/s (MS/s). In recent years, SAR ADCs have achieved sampling rates of several tens of MS/s to low GS/s with 5-bit to 10-bit resolutions in part due to a scaling down of the feature sizes of Complementary Metal Oxide Semiconductor (CMOS).

As the sampling frequency increases, the SAR ADCs have reduced amount of time for digital-to-analog converter (DAC) capacitor network settling. For example, a typical 10-bit 100 MS/s SAR ADC, has less than 0.4 ns in each sampling cycle for DAC capacitor network to settle after accounting for sampling settling time, comparator active time, and SAR logic delay time. Increased interconnect line impedance due to the use of advanced CMOS processes may also slow down charge transfer of the capacitors in SAR ADCs, preventing SAR ADCs to operate at a higher sampling speed.

SUMMARY

Embodiments relate to a successive approximation register (SAR)-based analog-to-digital converter (ADC) that can increase a time frame allocated for the settling of capacitors in a digital-to-analog converter (DAC) capacitor network.

In one embodiment, the ADC can include a comparator that includes a first input for receiving an input voltage signal and a second input for receiving a signal representing a reference voltage signal. The comparator can generate a comparator output signal representing a difference between the input voltage signal and the reference signal during a first comparison cycle. The ADC can also include a control logic that includes a first input coupled to the comparator to receive the comparator output signal and a second input for receiving a clock signal. The control logic can generate a control output signal representing the comparator output signal at a latching time defined by a switching of the clock signal. The ADC can further include a DAC capacitor array coupled to the comparator. The DAC capacitor array can receive the comparator output signal from the comparator before the latching time and can generate an approximation of the input voltage signal.

In one embodiment, the comparator output signal can be provided from the comparator to the DAC capacitor array before the comparator is reset during the first comparison cycle.

In one embodiment, the ADC can further include a window circuit coupled between the control logic and the DAC capacitor array. The window circuit can include a first transmission gate that can provide the comparator output signal before the latching time to the DAC capacitor array. The window circuit can also include a second transmission gate that can provide the comparator output signal after the latching time to the DAC capacitor array.

In one embodiment, the first comparison cycle can be defined by a second clock signal different from the clock signal.

In one embodiment, the control logic can further include a data valid circuit that can generate a valid signal representing an active mode of the comparator.

In one embodiment, the control logic can further generate a bit value of a digital approximation of the input voltage signal.

In one embodiment, the comparator can generate the comparator output signal, the control logic can generate the control output signal, and the DAC capacitor array can generate the approximation of the input voltage signal for N number of comparison cycles, where N is an integer greater than one.

In one embodiment, the control logic can further include an asynchronous clock generator that can generate N number of asynchronous clock signals used for latching of the comparator output signal. A first asynchronous clock signal of the N asynchronous clock signals can be used for latching of the comparator output signal during the first comparison cycle. A second asynchronous clock signal of the N asynchronous clock signals can be used for latching of the comparator output signal during the second comparison cycle. An Nth asynchronous clock signal of the N asynchronous clock signals can be used for latching of the comparator output signal during the Nth comparison cycle.

In one embodiment, the asynchronous clock generator can further generate N number of window pulses used for providing the comparator output signal to the DAC capacitor array. A first window pulse of the N window pulses can be used for providing the comparator output signal during the first comparison cycle. A second window pulse of the N window pulses can be used for providing the comparator output signal during the second comparison cycle. An Nth window pulse of the N window pulses is used for providing the comparator output signal during the Nth comparison cycle.

Embodiments also relate to operating an SAR ADC to generate and provide a comparator output signal to a DAC capacitor array for increasing a time frame allocated for the settling of capacitors in the DAC capacitor array.

In one embodiment, a comparator output signal representing a difference between an input voltage signal and a signal representing a reference voltage signal can be generated during a first comparison cycle. A control output signal representing the comparator output signal at a latching time defined by a switching of a clock signal can be generated. An approximation of the input voltage signal can be generated in response to receiving the comparator output signal before the latching time.

Embodiments also relate to a non-transitory computer-readable medium storing a digital representation of the ADC that can increase a time frame allocated for the settling of capacitors in a DAC capacitor network.

DETAILED DESCRIPTION

Figure 1:
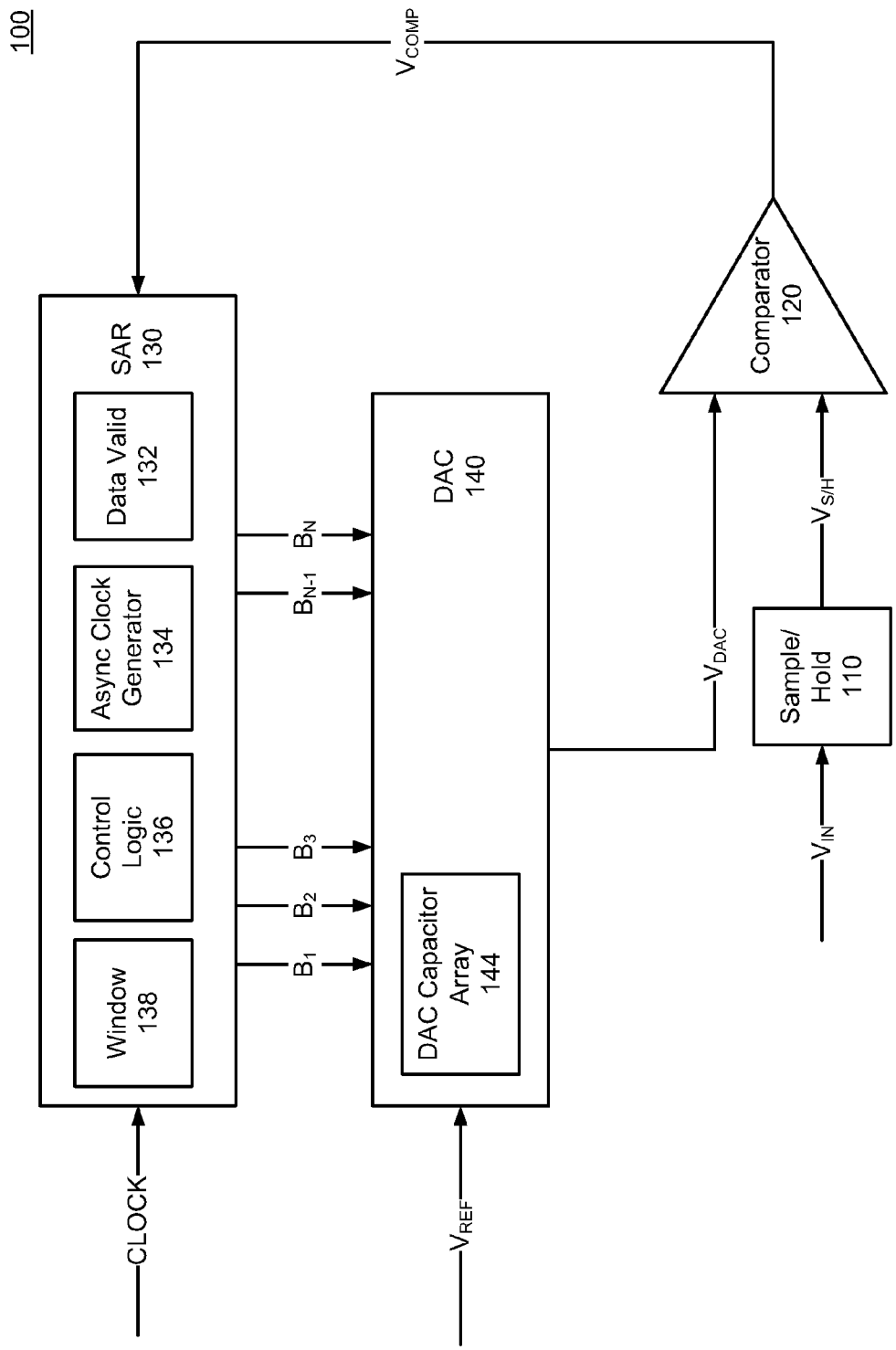
FIG. 1 is a high-level block diagram of a successive approximation register (SAR)-based analog-to-digital converter (ADC), according to one embodiment.

The Figures (FIGS.) and the following description relate to various embodiments by way of illustration only. It should be noted that from the following discussion, alternative embodiments of the structures and methods disclosed herein will be readily recognized as viable alternatives that may be employed without departing from the principles discussed herein. Reference will now be made in detail to several embodiments, examples of which are illustrated in the accompanying figures. It is noted that wherever practicable similar or like reference numbers may be used in the figures and may indicate similar or like functionality.

Embodiments of the present disclosure relate to successive approximation register (SAR)-based analog-to-digital converters (ADCs) that increase a time frame allocated for the settling of capacitors in a digital-to-analog converter (DAC) capacitor network by feeding a comparator output signal to the DAC capacitor to begin DAC capacitor settling before the comparator output is latched by a clock signal at a latching time. The SAR ADC can include a window circuit that provides the comparator output directly from the comparator to the DAC before the latching time of the comparator. After the latching time, the latched version of the comparator output is provided to the DAC capacitor. By providing the capacitor output to the DAC capacitor before latching, DAC capacitor can settle earlier compared to an SAR ADC where DAC capacitor settling begins after the latching time of the comparator.

The term "logical high level" described herein refers to a voltage level of a digital circuit that is close to the supply voltage of the circuit. For example, in a digital circuit with supply voltage VDD and ground voltage GND, a logical high level is VDD or within a noise margin of VDD.

The term "logical low level" described herein refers to a voltage level of a digital circuit that is close to a ground voltage level of the circuit. For example, a logical low level is GND or within a noise margin of GND.

SAR ADC is a type of ADC that converts a continuous analog signal into a discrete digital representation via a binary search though all possible quantization levels before converging upon a digital output that approximates the analog signal. An N-bit SAR ADC generates the digital output after N comparison cycles. The SAR ADC typically includes a sample and hold circuit that acquires the analog input voltage signal $V_{IN}$. Each comparison cycle begin with a comparator circuit comparing the sampled input signal with the output of an internal reference DAC and outputs the result of the comparison to the SAR circuit. The SAR circuit is designed to generate a digital code that approximates Vin to the internal reference DAC, which supplies the comparator with an analog voltage equivalent of the digital code output of the SAR such that the analog voltage equivalent ranges between zero and an input reference voltage $V_{REF}$. This completes the first comparison cycle. The other N-1 comparison cycles are similar to the first comparison cycle except that in each comparison cycle the output of the internal reference DAC is generated based on the output of the SAR from the previous comparison cycle. At the end of N comparison cycles, the SAR ADC converges to a final digital output that approximates the analog signal.

FIG. 1 is a high-level block diagram of SAR ADC 100, according to one embodiment. ADC 100 receives analog input voltage signal $V_{IN}$, and converts it to an N-bit digital signal $B_N$ through $B_1$ ($B_N$:$B_1$). For this purpose, ADC 100 includes, among other components, sample/hold circuit 110, comparator 120, SAR circuit 130, and DAC 140. While an ADC is typically implemented as a differential circuit, ADC 100 in FIG. 1 and following figures is depicted as a single-ended circuit for the sake of simplicity. For example, although a comparator 120 may output a positive output and negative output whose difference represents a comparator output, FIG. 1 is simplified to depict a single comparator output $V_{COMP}$.

Sample/Hold circuit 110 samples analog input signal $V_{IN}$ at a sampling frequency and holds the sampled signal $V_{S/H}$ to provide it as an input to comparator 120. Various types of sample/hold circuit 110 currently being used or to be developed may be used, and detailed description thereof is omitted herein for the sake of brevity.

Comparator 120 compares sampled signal $V_{S/H}$ with that of a representation of a reference signal (i.e., $V_{DAC}$) to determine whether sampled signal $V_{S/H}$ is larger or smaller than $V_{DAC}$ over a number of comparison cycles that correspond to N. $V_{DAC}$ is an analog representation of a digital input to DAC (i.e., $B_N$:$B_1$). The analog value of $V_{DAC}$ signal is generated based on an analog reference input signal $V_{REF}$ that is received at DAC 140 such that the value of $V_{DAC}$ signal is translated to a voltage between zero and $V_{REF}$. For example, when a 4-bit SAR ADC uses a binary search algorithm, an initial value of the 4-bit SAR is set to 1000, where the most significant bit (MSB) is set to a logical high level. The 4-bit SAR's value of 1000 causes DAC 140 to output $V_{DAC}$ corresponding to $V_{REF}/2$.

In each comparison cycle, comparator 120 outputs an output signal $V_{COMP}$ that is either at a logical high level ("1") or a logical low level ("0"). In one embodiment, comparator 120 is configured to output a signal at a logical high level when sampled signal $V_{S/H}$ is larger than $V_{DAC}$ signal and at a logical low level when sampled signal $V_{S/H}$ is equal to or smaller than $V_{DAC}$ signal. Alternatively, comparator 120 is configured to output the signal at a logical low level when sampled signal $V_{S/H}$ is larger than $V_{DAC}$ signal and at a logical high level when sampled signal $V_{S/H}$ is equal to or smaller than $V_{DAC}$ signal.

SAR 130 receives $V_{COMP}$ signal and generates an N-bit digital output signal, $B_N$:$B_1$. In an embodiment where ADC 100 implements a binary search algorithm, SAR 130 is initialized to a value 1000 . . . 000, where MSB representing $B_N$ is set to a logical high level and the rest of the bits $B_1$ through $B_{N-1}$ are set to a logical low level. A value for $B_N:B_1$ of 1000 . . . 000 corresponds to $V_{REF}/2$. In the first comparison clock cycle, comparator 120 compares sampled signal $V_{S/H}$ with $V_{DAC}$ signal that corresponds to $V_{REF}/2$. If sampled signal $V_{S/H}$ is larger than $V_{REF}/2$, comparator 120 outputs a signal at a logical high level to SAR 130. In response, SAR 130 retains the value of MSB (i.e., $B_N$ currently at logical high level) and sets the next bit (i.e., $B_{N-1}$) to a logical high level for the second comparison clock cycle. SAR 130 output for the second comparison cycle would be 1100 . . . 000, which corresponds to a value of reference signal that is larger than $V_{REF}/2$.

On the other hand, if sampled signal $V_{S/H}$ is smaller than or equal to $V_{REF}/2$, comparator 120 outputs a signal at a logical low level, and SAR 130 sets MSB (i.e., $B_N$) to a logical low level and sets the next bit (i.e., $B_{N-1}$) to a logical high level. In this scenario, SAR 130 output for the second comparison cycle would be 0100 . . . 000, which corresponds to a value of reference signal that is smaller than $V_{REF}/2$. Accordingly, $V_{DAC}$ value for the second comparison value can correspond to a value larger than or smaller than $V_{REF}/2$ depending on comparator 120 output from the previous comparison cycle. Then SAR ADC 100 proceeds to the second comparison cycle. In the second comparison cycle, comparator 120 repeats the comparison step for the second comparison cycle using the same sample signal $V_{S/H}$ as in the first comparison cycle but receiving $V_{DAC}$ that corresponds to the updated SAR 130 output of 0100 . . . 000. The comparison of updated $V_{DAC}$ with the same sampled signal $V_{S/H}$ is repeated over subsequent comparison cycles to determine all bit values in output signal $B_N:B_1$.

To implement the above-described functionality of generating an N-bit digital output signal, $B_N:B_1$, SAR 130 includes data valid circuit 132, async clock generator 134, control logic 136, and window circuit 138. Data valid circuit 132 receives comparator output $V_{COMP}P$ and $V_{COMP}N$ and generates a Valid signal to indicate that comparator 120 is in an active mode of operation. For example, the two outputs of the differential comparator output signal can be passed through a 2-input digital NAND gate to generate the Valid signal. In the NAND gate example, both outputs of comparator 120 are set to a logical high level by default (i.e., when comparator 120 is reset) and when either one of the outputs toggles to reach a logical low level (responsive to a comparison by comparator 120 in an active mode), Valid signal would reach a logical high level after an appropriate propagation delay associated with the 2-input NAND gate. Alternatively, if the outputs of comparator 120 are set to a logical low level by default, a 2-input digital OR gate can generate the Valid signal.

Async clock generator 134 generates N asynchronous clock signals for the N-bit SAR that are used to latch comparator output $V_{COMP}$. For example, in a 4-bit SAR ADC, async clock generator 134 generates four asynchronous clocks for each of the four control logic blocks, as described below in detail with reference to FIG. 3. These asynchronous clock signals are labeled as CLKi in FIG. 3, where "i" ranges from 1 to 4. Asynchronous clock signals can be used by control logic 136 to generate a latched version of $V_{COMP}$ signal that is further converted into a bit value of a digital approximation of input voltage signal $V_{IN}$ (i.e., $B_N:B_1$). Async clock generator 134 also generates N Window_i (i ranging from 1 to N) pulses that are used in providing a version of comparator output signal $V_{REF}$ to DAC 140. Control logic 136 includes N identical control blocks, one of which is depicted and described in detail below with reference to FIG. 3. Window 138 receives N Window_i pulses from async clock generator 134 to either provide comparator output signal VREF directly from comparator 120 to DAC 140 or to provide the latched version of comparator output signal (i.e., $B_N:B_1$) to DAC 140.

DAC 140 receives an N-bit digital signal $B_N:B_1$ from SAR 130 and an analog reference signal $V_{REF}$, and converts the digital signal into a corresponding analog output signal $V_{DAC}$ such that a signal value for $V_{DAC}$ lies between a lower bound of zero and an upper bound of $V_{REF}$. In one embodiment, DAC 140 can be implemented using DAC capacitor array 144, as described in Chun-Cheng Liu et al., "A 10-bit 50-MS/s SAR ADC with a Monotonic Capacitor Switching Procedure," IEEE Journal of Solid-State Circuits, Vol. 45, No. 4, April 2010 pp. 731-40 ("ADC paper"), which is incorporated by reference in its entirety herein. DAC capacitor array 144 can be implemented as a binary-weighted capacitor array or a C-2C capacitor array. An operation of an N-bit SAR ADC is described below with reference to FIG. 2B.

Figure 2A:
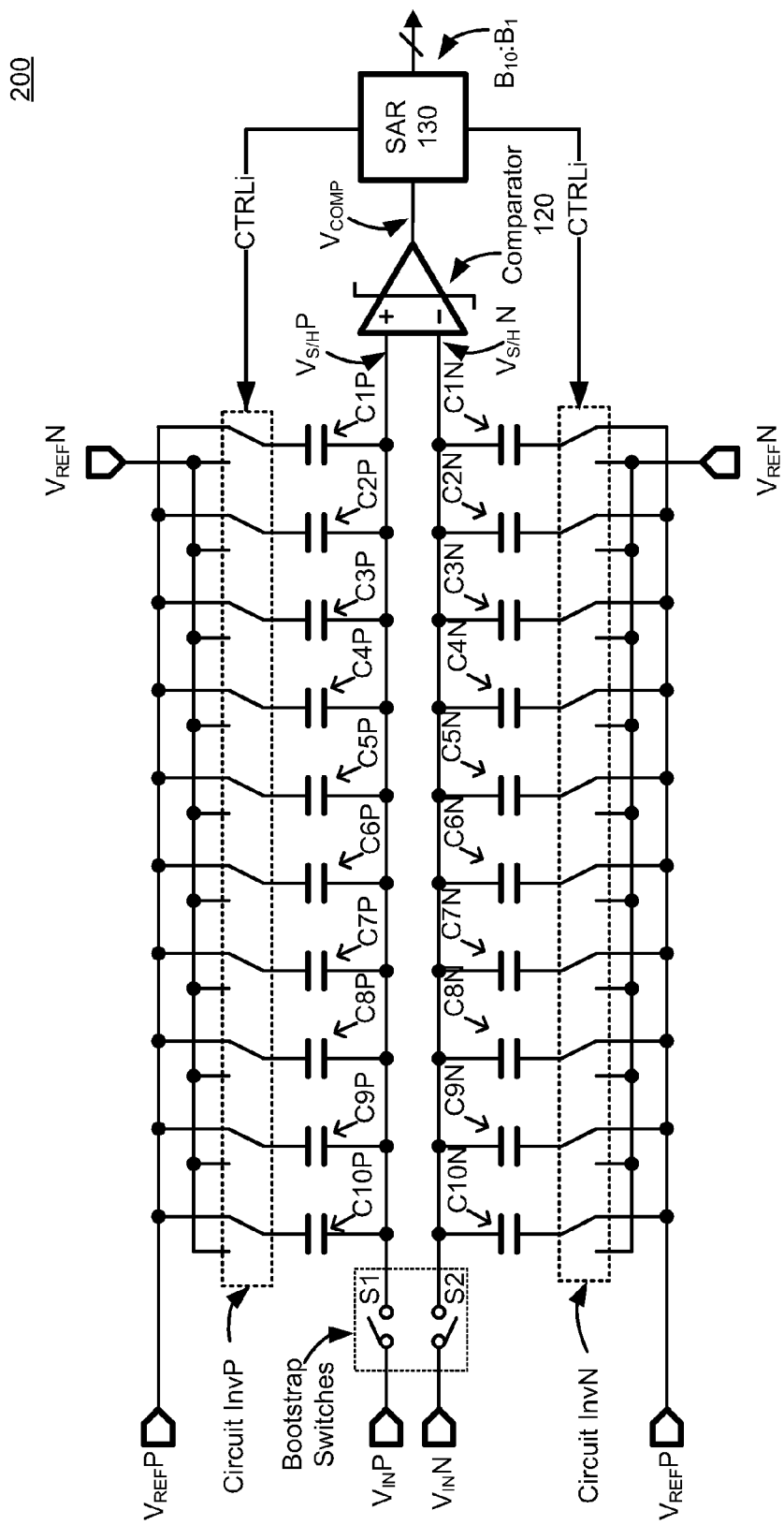
FIG. 2A is a block diagram illustrating an architecture of an SAR ADC, according to one embodiment.

FIG. 2A is a block diagram illustrating an architecture of SAR ADC 200, according to one embodiment. ADC 200 is based on a charge-redistribution architecture that includes a charge scaling DAC consisting of an array of individually switched binary-weighted capacitors. The capacitor array of the charge scaling DAC is also used to sample and hold functionality. While ADC 200 includes the same components described in ADC 100, a subset of the components are included in FIG. 2A to illustrate the ADC architecture. ADC 200 receives a differential analog input voltage signal $V_{IN}P$ and $V_{IN}N$ and generates digital bits $B_{10}:B_1$ that are a digital approximation of the received analog input signal. Input signal $V_{IN}P/V_{IN}N$ is sampled using bootstrap switches S1 and S2, and then the sampled signal $V_{S/H}P/V_{S/H}N$ is held using capacitor network C1P:C10P/C1N:C10N.

The first plates of the capacitor network C1P:C10P/C1N:C10N are connected to the sampled signal $V_{S/H}P/V_{S/H}N$ and the second plates are pulled to either the positive reference voltage signal $V_{REF}P$ or the negative reference voltage signal $V_{REF}N$. One difference between the capacitor network used in the ADC paper and in FIG. 2A of this disclosure is that the second plates of the capacitor network of the ADC paper are pulled to either a single-ended reference signal $V_{REF}$ or to a logical low level whereas the second plates of the capacitor network of this disclosure are pulled to either the positive reference voltage signal $V_{REF}P$ or the negative reference voltage signal $V_{REF}N$ of differential reference signal $V_{REF}$. As described in the ADC paper, the difference between sampled signals $V_{S/H}P$ and $V_{S/H}N$ represents a difference between input signal $V_{IN}$ and reference signal $V_{REF}$. The output signal $V_{COMP}$ of comparator 120 is fed to SAR 130, which generates digital approximation bits $B_{10}:B_1$.

SAR 130 also generates control signals CTRLi (i ranging from 1 to N) that are used in pulling the second plates of the capacitor network to reference signal $V_{REF}P/V_{REF}N$. An analog approximation voltage $V_{DAC}$ of the digital bits $B_{10}:B_1$ can be generated by a summation of a charge on all capacitors of the capacitor network. Due to a flexibility of being able to pull the second plate of each capacitor of the capacitor network C1P:C10P/C1N:C10N to either $V_{REF}P$ or $V_{REF}N$, the summation of a charge of the capacitors results in generating $V_{DAC}$ as a value that ranges between zero and $V_{REF}$ volts. An operation of ADC 100 is described in FIG. 2B below.

Figure 2B:
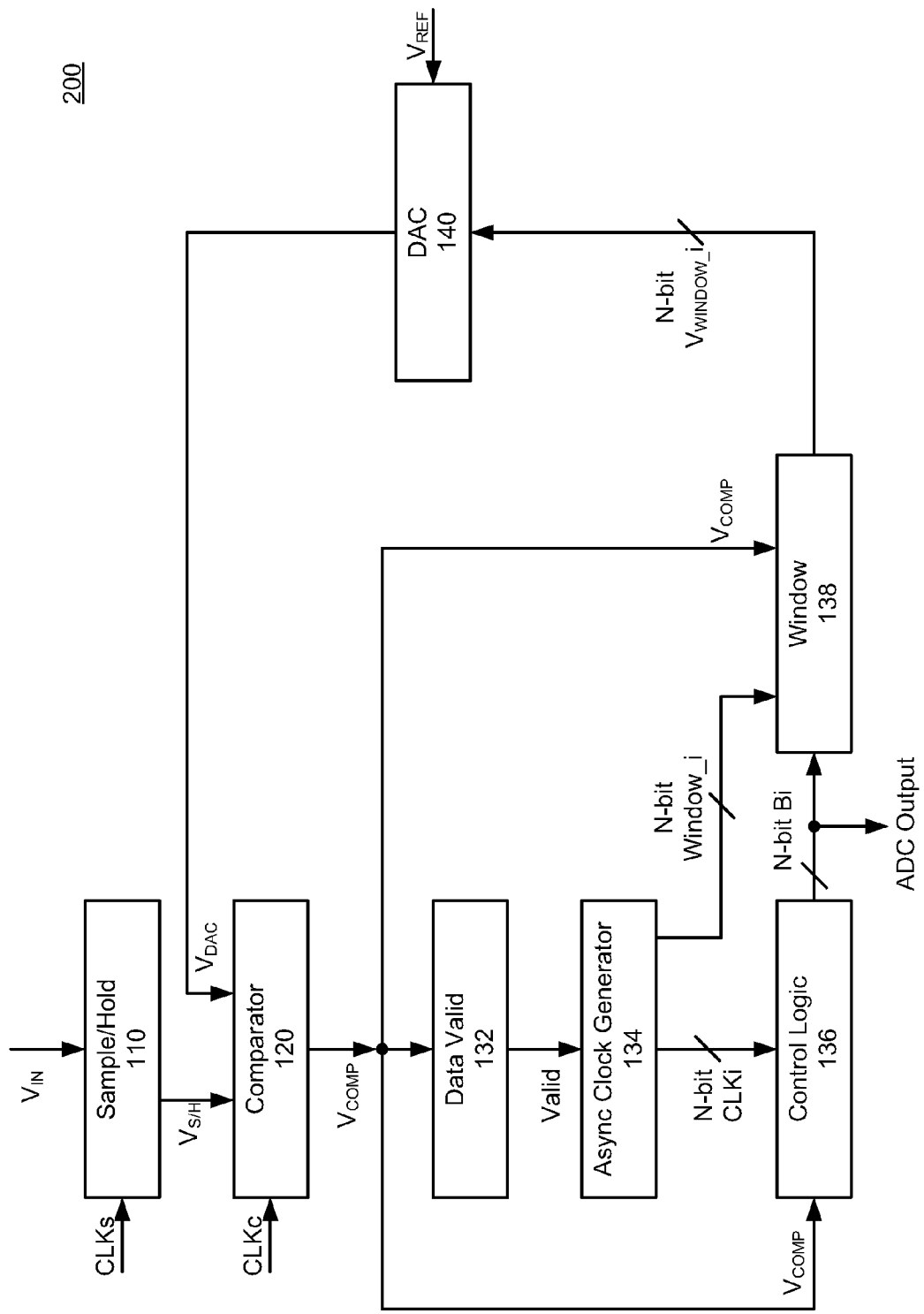
FIG. 2B is a high-level block diagram illustrating an operation of an SAR ADC, according to one embodiment.

FIG. 2B is a high-level block diagram illustrating an operation of N-bit SAR ADC 200, according to one embodiment. FIG. 2B illustrates an operation of signal flow through various components of the N-bit SAR ADC for a first comparison cycle of N comparison cycles. The operation described in FIG. 2B is also applicable to other comparison cycles of N comparison cycles of N-bit SAR ADC 100.

Sample/hold circuit 110 samples and holds analog input voltage signal $V_{IN}$ using sampling clock signal CLKs to generate an output signal $V_{S/H}$. Sample/hold circuit 110 samples $V_{IN}$ for a sampling duration of a clock period of sampling clock signal CLKs and then holds the sampled analog input voltage signal for a holding duration that continues until the end of the clock period. In one embodiment, the sampling duration extends for about 20 percent of one clock period of CLKs and the holding duration extends for the remaining about 80 percent of the one clock period. Output signal $V_{S/H}$ is then fed to comparator 120.

Comparator 120 compares sampled signal $V_{S/H}$ with a representation of reference signal $V_{REF}$ (i.e., $V_{DAC}$) to generate an output (i.e., $V_{COMP}$) representing a difference between sampled signal $V_{S/H}$ and reference signal $V_{REF}$. Comparator 120 performs one comparison for each time period of clock signal CLKc. Comparator 120 output signal $V_{COMP}$ is then fed to data valid circuit 132 to generate Valid signal that indicate that comparator is in an active mode of operation. Valid signal is then fed to async clock generator 134 that generates N number of clock signals CLKi (where i=1 to N representing a comparison cycle) used for latching comparator output and generating a bit value of a digital approximation of input voltage signal $V_{IN}$. Async clock generator 134 also generates N number of window pulse signals Window_i (where i=1 to N representing a comparison cycle) used for providing comparator output signal $V_{COMP}$ to DAC 140. The value of i in CLKi and Window_i ranges from 1 to N.

Control logic 136 receives comparator output signal $V_{COMP}$, which is latched using asynchronous clock signals CLKi at a latching time. The latched version of comparator output signal $V_{COMP}$ is further converted into a bit value of a digital approximation Bi of input voltage signal $V_{IN}$ (i.e., $B_N:B_1$). Digital approximation Bi is fed to window 138, which generates output signal $V_{WINDOW\_i}$ that is fed to DAC 140. Comparator output signal $V_{COMP}$ is also fed directly from comparator 120 to window 138. Window 138 generates $V_{WINDOW\_i}$ signal based on either comparator output $V_{COMP}$ directly received from comparator 120 or on a latched version of comparator output $V_{COMP}$. After comparator output signal $V_{COMP}$ is available, window 138 generates $V_{WINDOW\_i}$ signal based on comparator output $V_{COMP}$ directly received from comparator 120 for a time frame before the latching time of $V_{COMP}$ and based on the latched version of comparator output $V_{COMP}$ after the latching time. The operation of window 138 selected a direct version or a latched version of $V_{COMP}$ is described in detail with reference to FIGS. 3 and 4 below.

DAC 140 receives N-bit $V_{WINDOW\_i}$ signal and reference signal $V_{REF}$ to generate an analog approximation $V_{DAC}$ of the digital signal $V_{WINDOW\_i}$. DAC 140 converts digital signal $V_{WINDOW\_i}$ (i ranging from 1 to N) to an analog signal $V_{DAC}$ such that a signal value for $V_{DAC}$ lies between a lower bound of zero and an upper bound of $V_{REF}$. $V_{DAC}$ signal is then fed back to comparator 120 as a representation of $V_{REF}$ for a second comparison cycle. The second comparison cycle, a third comparison cycle, and an Nth comparison cycle are repeated similar to the first comparison cycle until the N-bit SAR ADC completes conversion of analog input voltage signal $V_{IN}$ into a N-bit digital approximation Bi (i=1:N).

Figure 3A:
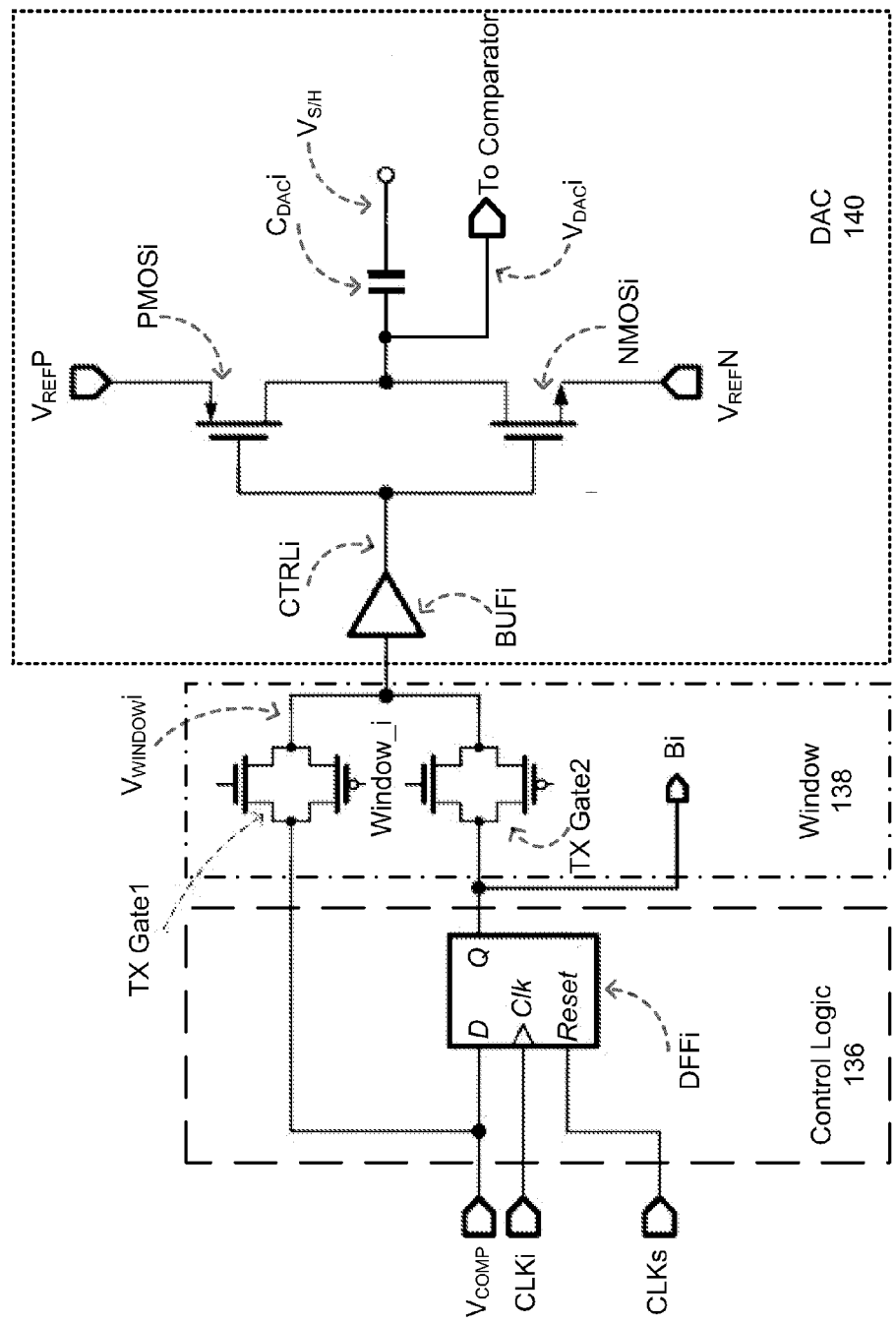
FIG. 3A is a block diagram illustrating selected circuit components of an SAR ADC, according to one embodiment.

FIG. 3A is a block diagram illustrating selected circuit components of SAR ADC 100, according to one embodiment. Control logic 136 receives comparator output signal $V_{COMP}$ and generates a latched version of comparator output signal $V_{COMP}$ using clock signal CLKi. The latched version of comparator output signal $V_{COMP}$ is translated into a bit value of a digital approximation (i.e., Bi) of input voltage signal $V_{IN}$. DAC 140 receives comparator output signal $V_{COMP}$ such that the comparator output signal is directly provided from the comparator (e.g., comparator 120) before a latching time of the comparator output signal $V_{COMP}$. To illustrate the receipt of comparator output signal $V_{COMP}$ before the latching time of $V_{COMP}$, FIG. 3 also illustrates other components including window circuit 138 and DAC 140.

Control logic 136 includes N number of D-type flip flops, DFFi with i ranging from 1 to N. FIG. 3 shows one of the N flip-flops, DFFi. DFFi receives comparator output $V_{COMP}$, clock signal CLKi, and clock signal CLKs as inputs. Clock signal CLKs is the sampling clock signal that resets DFFi when CLKs is set to a logical high level. For example, when CLKs is set to a logical high level, input voltage signal $V_{IN}$ is sampled, as described above with reference to FIG. 2B. During the time frame where input signal $V_{IN}$ is sampled, DFFi is reset to set the output signal of all flip-flops to a logical low level. After the sampling time frame and during a holding time frame of CLKs, DFFi enters an active mode of operation where comparator output $V_{COMP}$ is latched at an edge (either rising edge or a falling edge) of clock signal CLKi. The latched version of comparator output signal is translated into a bit value of a digital approximation (i.e., Bi) of input voltage signal $V_{IN}$.

DFFi begins a process of latching comparator output $V_{COMP}$ after switching of clock signal CKLi to an active state. Clock signal CLKi is switched to an active state after data valid circuit 132 generates Valid signal. Therefore, a time frame between the generation of comparator output $V_{COMP}$ and the latched version of $V_{COMP}$ includes time frames associated with the generation of Valid signal, switching of CLKi signals, and propagation delay of DFFi, as described below in detail with reference to FIG. 4.

Window circuit 138 may be embodied by two transmission gates TX gate1 and TX gate2 that can provide a version of comparator output signal to DAC 140. In one embodiment, each transmission gate TX gate1 and TX gate2 comprises an N-type complementary metal-oxide semiconductor (NMOS) device and a P-type complementary metal-oxide semiconductor (PMOS) device connected in parallel as shown in FIG. 3. Alternatively, transmission gates can be implemented with other forms of semiconductor switches well known in the art. The first transmission gate TX gate1 receives comparator output $V_{COMP}$ directly from comparator 120 and the second transmission gate TX gate2 receives a latched version of comparator output $V_{COMP}$ as represented by Bi. The output signal of both transmission gates TX gate1 and TX gate2 is $V_{WINDOW\_i}$ that is fed to DAC 330. The operation of transmission gates TX gate1 and TX gate2 is controlled by control signal Window_i. In one embodiment, when Window_i is set to a logical high level, TX gate1 is turned on and TX gate2 is turned off. And when Window_i is set to a logical low level, TX gate1 is turned off and TX gate2 is turned on. The generation of Window_i signals is described in detail with reference to FIG. 5 below.

When TX gate1 is turned on (e.g., when Window_i is at logical high level), TX gate1 provides comparator output $V_{COMP}$ to DAC 330 such that $V_{WINDOW\_i}$ represents the comparator output $V_{COMP}$ after a propagation delay associated with TX gate1. In contrast, TX gate2 is turned off to place TX gate2 in a high impedance state to prevent Bi from affecting signal $V_{WINDOW\_i}$. When TX gate2 is turned on (e.g., when Window_i is at logical low level), TX gate2 provides Bi (i.e., latched version of comparator output $V_{COMP}$) to DAC 330 such that $V_{WINDOW\_i}$ represents the latched version of comparator output $V_{COMP}$ after a propagation delay associated with TX gate2. In contrast, TX gate1 is turned off to configure TX gate1 in a high impedance state so that unlatched comparator output $V_{COMP}$ does not affect signal $V_{WINDOW\_i}$.

DAC 330 receives signal $V_{WINDOW\_i}$ and generates $V_{DAC}i$, which is an analog approximation of the received $V_{WINDOW}$ i. DAC 330 includes N buffers represented by BUFi and an N capacitor array represented by $C_{DAC}i$. Buffer BUFi receives $V_{WINDOW\_i}$ signal as an input and generates CTRLi as a buffered version of the received input signal. In one embodiment, one or more inverter circuits can be embodied as buffer BUFi. Signal CTRLi is then used to set one side plate connected to PMOSi and NMOSi of capacitor $C_{DAC}i$ to either $V_{REF}P$ or $V_{REF}N$ as $V_{DAC}i$), where $V_{REF}P$ is the positive single-ended signal and $V_{REF}N$ is the negative single-ended signal of differential reference signal $V_{REF}$. For example, if CTRLi is at a logical high level, NMOSi is turned ON and PMOSi is turned off, and $V_{DAC}i$ is set to $V_{REF}N$. On the other hand, if CTRLi is at a logical low level, PMOSi is turned ON and NMOSi is turned off, and $V_{DAC}i$ is set to $V_{REF}P$.

In one embodiment, capacitor network can serve both as a sample/hold circuit and also as a DAC capacitor array such that sampled signal $V_{S/H}$ is provided to first plates of the capacitor array and either $V_{REF}P$ or $V_{REF}N$ is provided to second plates of the capacitor array as described above with reference to FIG. 2A. At the beginning of the first comparison cycle, the second plates of all capacitors of DAC capacitor array are pulled to $V_{REF}P$ and the first plates are pulled to sampled signal $V_{S/H}$. If CTRL(N) is at a logical high level at the end of the first comparison cycle, the second plate of $C_{DAC}N$ (associated with MSB) is set to $V_{REF}N$ while keeping the second plates of the other capacitors at $V_{REF}P$. The SAR ADC then proceeds to operate in a second comparison cycle where the second plate of the next capacitor $C_{DAC}N-1$ (associated with bit MSB-1) is set to either $V_{REF}N$ if CRTL(N-1) is at logical high level or maintained at $V_{REF}P$ if CTRL(N-1) is at logical low level. At the end of the second comparison cycle, the second plate of $C_{DAC}N$ is not changed irrespective of the value of CTRLi for the second comparison cycle. The process of setting the second plate voltage level of each capacitor of DAC capacitor array is continued N times until $C_{DAC}0$ associated with the LSB is set in the Nth comparison cycle.

In one embodiment, DAC capacitor array may be embodied as a binary-weighted capacitors connected such that the first plates of each capacitor pulled to sampled signal $V_{S/H}$, and the second plate of each capacitor is pulled to either $V_{REF}P$ or $V_{REF}N$, as described above. A DAC capacitor array with all first plates pulled to sampled signal $V_{S/H}$ and the second plates pulled to reference signal $V_{REF}$ (either $V_{REF}P$ or $V_{REF}N$) can function as a DAC such that combined voltage on signals $V_{DAC}i$ at each comparison cycle would generate an equivalent $V_{DAC}$ signal as described above with reference to FIG. 2A of this disclosure.

Figure 3B:
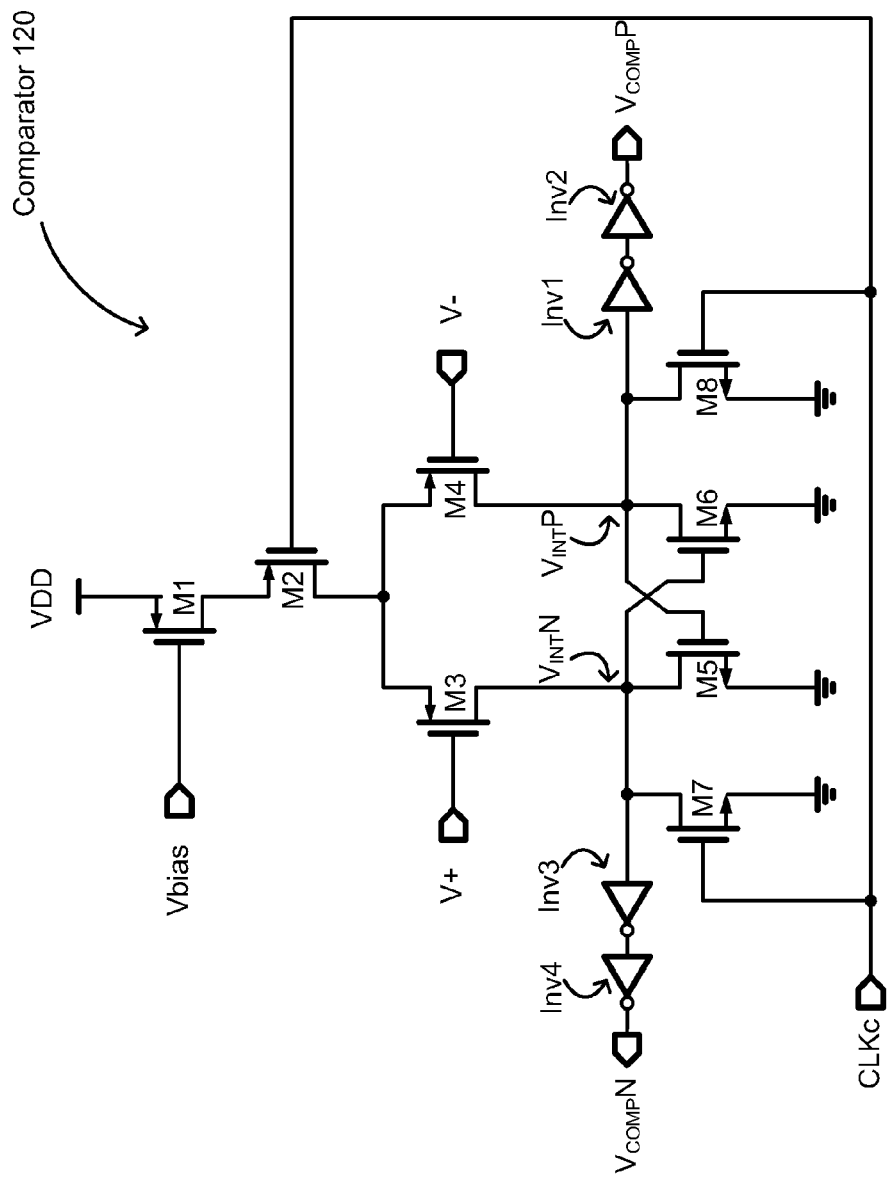
FIG. 3B is a circuit diagram illustrating a comparator of an SAR ADC, according to one embodiment.

FIG. 3B is a circuit diagram illustrating comparator 120 of SAR ADC 100, according to one embodiment. Comparator 120 receives differential input signal V+ and V− to generate a differential output signal $V_{COMP}P$ and $V_{COMP}N$ that represents a difference between single ended signals V+ and V−. Differential input signal V+ and V− represents a voltage difference between analog input voltage signal $V_{IN}$ and reference signal $V_{REF}$ as described above with reference to FIG. 2A. Clock signal CLKc controls the operation of comparator 120 by placing comparator 120 in an active mode when CLKc is at a logical low level and in an inactive mode (i.e., reset mode) when CLKc is at a logical high level. Comparator 120 executes one comparison for every clock cycle of signal CLKc. Voltage signal Vbias provides direct current (DC) bias for comparator 120.

When CLKc is at logical high level, PMOS device M2 is turned off to switch off the DC bias, and NMOS devices M7 and M8 are turned on to pull internal nodes $V_{INT}P$ and $V_{INT}N$ to a logical low level to place comparator 120 in an inactive mode. In response to internal nodes $V_{INT}P$ and $V_{INT}N$ getting pulled to a logical low level, inverter devices Inv1, Inv2, Inv3, and Inv4 will pull outputs $V_{COMP}P$ and $V_{COMP}N$ to a logical low level.

On the other hand, when CLKc is at logical low level, PMOS device M2 is turned on to provide the DC bias, and NMOS devices M7 and M8 are turned off to place comparator 120 in an active comparison mode. In the active comparison mode, differential pair M3 and M4 compares the two input signals V+ and V− to generate an amplified delta signal at internal nodes $V_{INT}P$ and $V_{INT}N$. The voltage signal at each of the internal nodes $V_{INT}P$ and $V_{INT}N$ is then converted to a rail-to-rail digital signal by inverters Inv1 and Inv2, and Inv3 and Inv4 to generate a digital output differential signal $V_{COMP}P$ and $V_{COMP}N$. Waveform diagrams illustrating comparator 120's active and inactive modes are shown below in FIG. 4.

Figure 4:
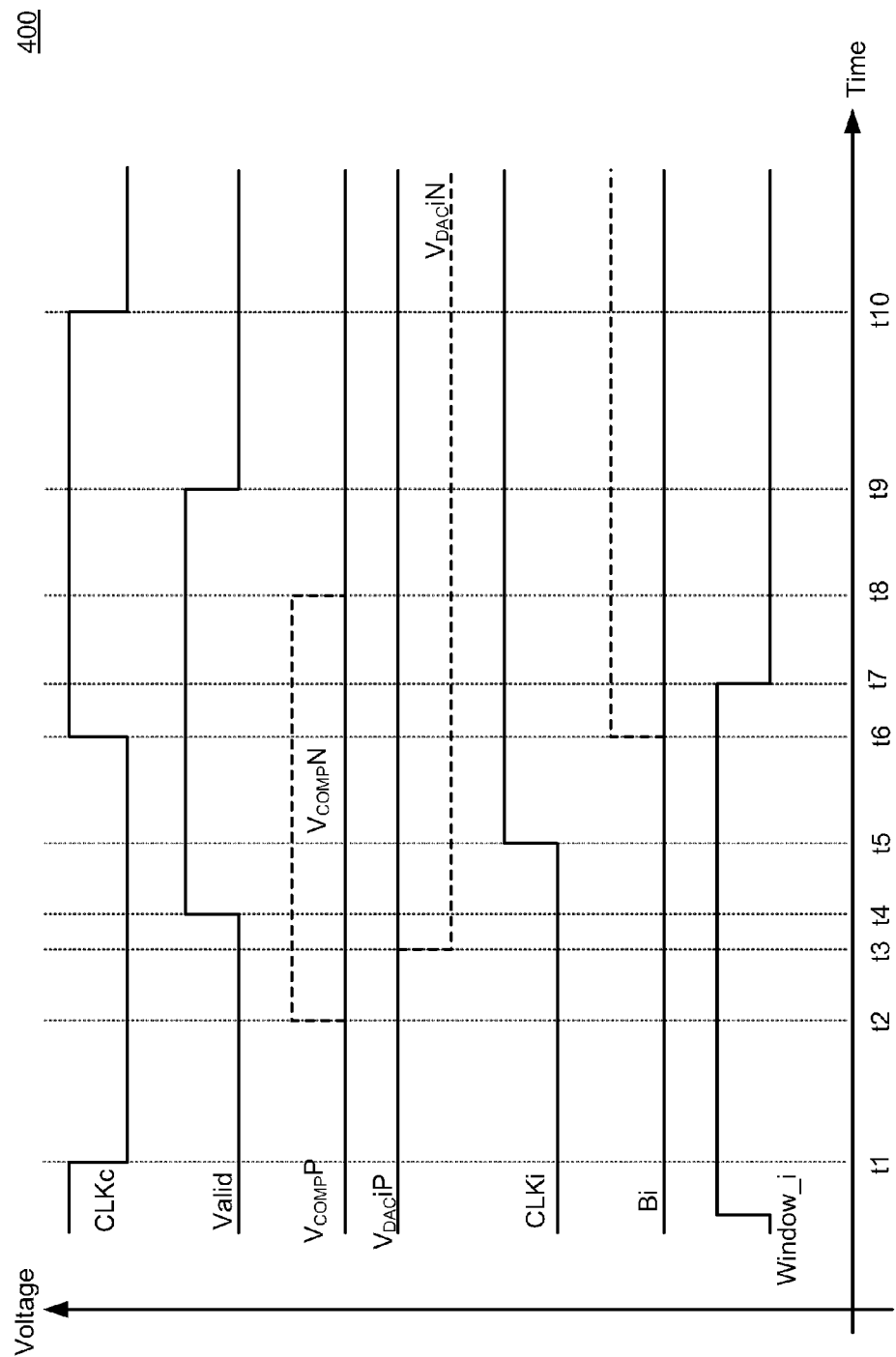
FIG. 4 is a timing diagram illustrating an operation of one comparison clock cycle of an SAR ADC, according to one embodiment.

FIG. 4 is a timing diagram illustrating an operation of one comparison cycle of an SAR ADC (e.g., SAR ADC 100), according to one embodiment. In FIG. 4, x-axis represents time and y-axis represents voltage of various signals. Time axis includes various points in time, t1 through t10, represented by vertical dotted lines. FIG. 4 shows comparison clock signal CLKc. The time period between points t1 and t10 constitutes one period of CLKc (i.e., one comparison cycle). While FIG. 4 shows timing waveforms for only one comparison cycle, FIG. 4 is also applicable to the operation of the SAR ADC for each of its N comparison cycles.

When CLKc is at logical high level before point t1, comparator 120 is reset to output signals $V_{COMP}P$ and $V_{COMP}N$ at logical low level, and Valid signal is also set to a logical low level. Control logic 310 is implemented such that when each of sampling clock signal CLKs, an end of capacitor array (EOC) signal, and Valid signal is at a logical low level, CLKc signal is set to a logical low level at point t1. For example, CLKc can be generated by a 3-input digital OR gate that receives CLKs, EOC, and Valid signals as inputs. Valid signal indicates that the comparator is in an active mode and can be generated by a logical OR operation of comparator output signals $V_{COMP}P$ and $V_{COMP}N$. Comparator 120 of the SAR ADC is configured to be triggered on a falling edge of clock signal CLKc. At a falling edge of CLKc at point t1, the comparator begins its operation to generate an output at point t2 such that either $V_{COMP}P$ or $V_{COMP}N$ toggles to a logical high level. The time period between points t1 and t2 represents a generation time of the comparator.

When comparator output signal $V_{COMP}P/V_{COMP}N$ is generated at point t2, $V_{COMP}P/V_{COMP}N$ is available to window 138 at point t2 and window 138 can begin to generate $V_{WINDOW\_i}$ as long as Window_i signal is set to a logical high level as described above with reference to FIG. 3. Window_i signal is generated by a combination of signals CLKi and CLKs as will be described in detail below with reference to FIG. 5. Window_i is set to a logical high level before point t1 and will remain at the logical high level at least until the comparator output is latched with CLKi. The falling edge of Window_i signal must also occur before a falling edge of the comparator output $V_{COMP}P/V_{COMP}N$ appears at point t8 because the latched comparator output Bi has to be provided to DAC 140 before the comparator output changes at point t8.

Window_i signal controls the transmission gates TX gate1 and TX gate2 of window 320 such that TX gate1 is turned on when Window_i is at a logical high level and TX gate2 is turned on when Window_i is at a logical low level. When Window_i is set to logical high level to turn on TX gate1, comparator output $V_{COMP}P/V_{COMP}N$ at point t2 is provided through TX gate1 to generate $V_{WINDOW}i$, CTRLi, and $V_{DAC}i$ signals at point t3. The time period between points t2 and t3 represents a signal propagation time of TX gate1, BUFi, and either PMOSi or NMOSi. Because $V_{DAC}i$ is available at point t3, the remaining time frame until the end of the comparison cycle from point t3 to point t10 is available for DAC capacitor settling.

Valid signal can be generated as a logical OR operation of comparator outputs $V_{COMP}P$ and $V_{COMP}N$ to indicate a change in either of $V_{COMP}P$ or $V_{COMP}N$. For example, Valid signal can be generated by a 2-input digital OR gate that receives $V_{COMP}P$ and $V_{COMP}N$ as its inputs. After one of the comparator outputs has changed its value at point t2, Valid signal is generated and set to a logical high level at point t4. The time period between points t2 and t4 represents a signal propagation delay of the 2-input digital OR gate.

A rising edge of Valid signal at point t4 will trigger the generation of clock signals CLKi. Clock signals CLKi are generated at point t5 shown by a rising edge and the time period between points t4 and t5 represents a time period associated with the generation of CLKi. A rising edge of clock signal CLKi at point t5 will trigger a latching of comparator output $V_{COMP}P/V_{COMP}N$ by DFFi. DFFi generates Bi signal representing a latched version of comparator output $V_{COMP}P/V_{COMP}N$ shown as a rising edge at point t6. The time period between points t5 and t6 represents a time period associated with a CK-Q time of flip-flop DFFi.

A rising edge of Valid signal at point t4 will also trigger clock signal CLKc to be set to logical high level as shown at point t6. The time period between points t4 and t6 represents a time period associated with a signal propagation delay of a circuit generating CLKc signal (e.g., 3-input digital OR gate). A rising edge of clock signal CLKc at point t6 will reset the comparator to output each of the comparator outputs $V_{COMP}P$ and $V_{COMP}N$ at a logical low level at point t8. The time period between points t6 and t8 represents a time period associated with resetting the comparator. In one embodiment, comparator output signal $V_{COMP}P/V_{COMP}N$ is provided from the comparator to DAC capacitor array before the comparator is reset at point t8.

Window_i signal is set to a logical low level at point t7 such that its falling edge occurs after Bi signal toggles at point t6 and before comparator output $V_{COMP}P/V_{COMP}N$ is reset at point t8. When Window_i is set to logical low level to turn on TX gate2 at point t7, the latched comparator output Bi is provided through TX gate2 to generate $V_{WINDOW}i$, CTRLi, and $V_{DAC}i$ signals. That is, $V_{DAC}i$ after point t7 (in reality after accounting for signal propagation delay associated with TX gate2, BUFi, and either PMOSi or NMOSi) is based on the latched version of comparator output (i.e., Bi). In other words, between points t2 and t7, $V_{DAC}i$ is based on comparator output that is directly fed from the comparator to window 320, whereas between points t7 and t10, $V_{DAC}i$ is based on a latched version of the comparator output. By feeding comparator output signal $V_{COMP}$ to the DAC capacitor array before the latching time, the DAC capacitor array has a longer time frame of the sampling clock period (i.e., CLKs) for the settling of its capacitors compared to an implementation where the DAC capacitor array would receive comparator output signal $V_{COMP}$ only after the latching time (i.e., after point t6). That is, by feeding comparator output signal $V_{COMP}$ to the DAC capacitor array before the latching time, the time frame for the DAC capacitor settling has an additional time from point t3 to t6.

At point t8 when comparator output $V_{COMP}P/V_{COMP}N$ is reset to a logical low value, Valid signal is also set to a logical low value at point t9 after a single propagation delay. Point t10 represents the end of the comparison cycle represented by clock CLKc. The generation of signals CLKi and Window_i are described below with reference to FIG. 5.

Figure 5:
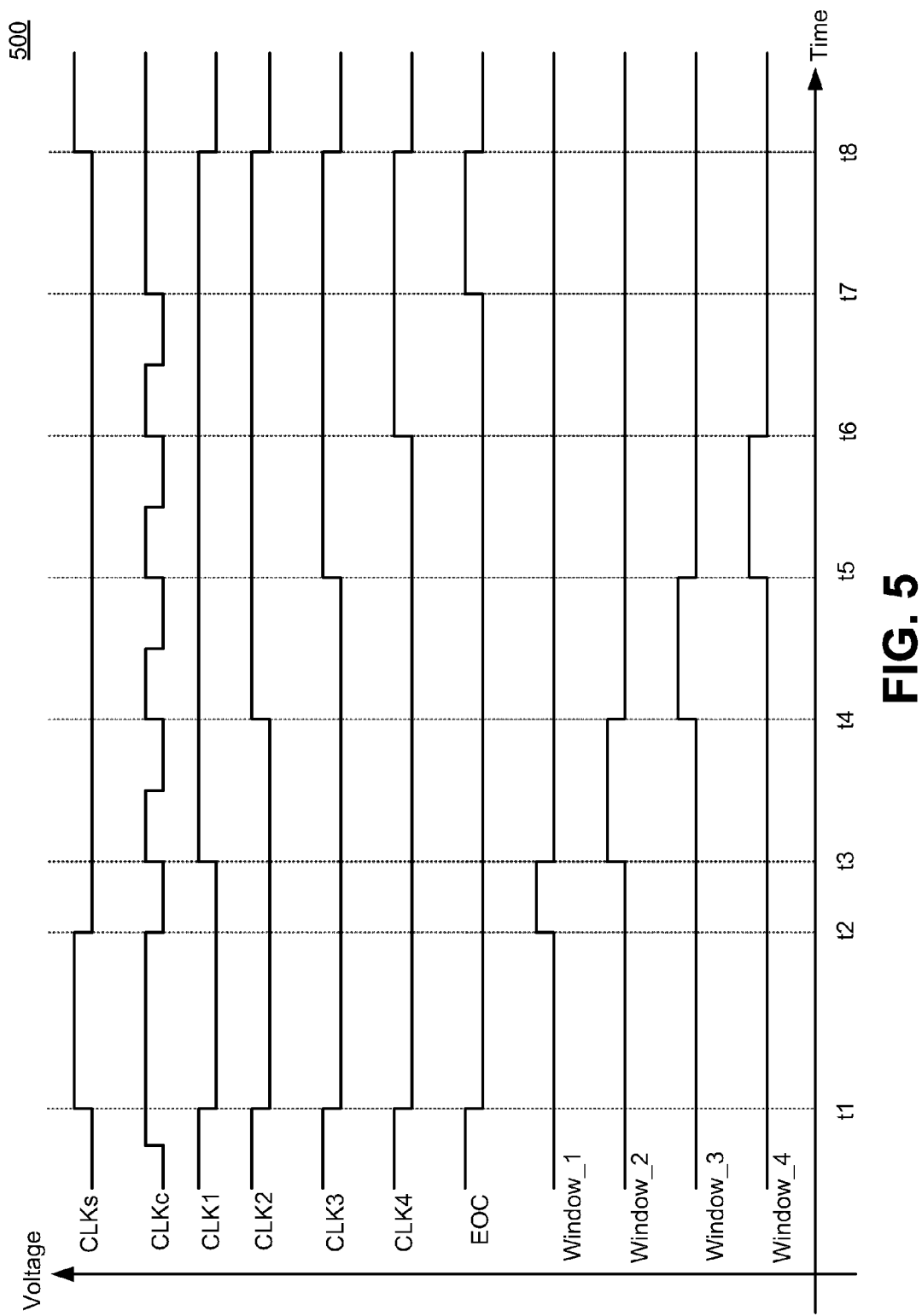
FIG. 5 is a timing diagram illustrating clock signals of a 4-bit SAR ADC, according to one embodiment.

FIG. 5 is a timing diagram illustrating clock signals of a 4-bit SAR ADC, according to one embodiment. In FIG. 5, x-axis represents time and y-axis represents voltage of various signals. Time axis includes various points in time, t1 through t8, represented by vertical dotted lines. FIG. 5 shows sampling clock signal CLKs and comparison clock signal CLKc. The time period between points t1 and t8 constitutes one period of CLKs, which represents a time period for converting an analog input voltage into a 4-bit digital output. FIG. 5 shows at least four comparison clock cycles between points t3 and t7. An operation of the SAR ADC in each comparison clock cycle is described above with reference to FIG. 4. FIG. 5 also shows clock signals CLKi and window pulse signals Window_i.

Sampling clock signal CLKs controls a sample and hold circuit (e.g., sample/hold 110) by sampling an analog input voltage $V_{IN}$ when CLKs is at a logical high level and holding the sampled value when CLKs is at a logical low level. The sampling time frame of CLKs is shown between points t1 and t2, and the holding time frame is shown between t2 and t8. For example, the sampling time frame is set to about 20% of CLKs time period. The holding time frame includes at least four CLKc clock cycles (or N cycles for an N-bit SAR ADC) for the 4-bit SAR ADC. The first CLKc clock cycle is between points t3 and t4, the second cycle is between points t4 and t5, the third cycle is between points t5 and t6, and the fourth cycle is between points t6 and t7.

Clock signals CLK1 through CLK4 (i.e., CLKi, where i=1:4) are used for latching the comparator output by flip-flops DFFi. Clock signals CLK1 through CLK4 are generated as asynchronous clock signals to avoid using of a high-frequency synchronous clock signal in the SAR ADC. At the rising edge of CLKi, flip-flop DFFi samples the comparator output. If the comparator output is high, the bottom plate of the relevant capacitor of the DAC capacitor array is switched from $V_{REF}P$ to $V_{REF}N$, as discussed above with reference to FIG. 3. If the comparator output is low, the bottom plate of the relevant capacitor of the DAC capacitor array is continued to be connected to $V_{REF}P$. To ensure that only one capacitor of the DAC capacitor array is switched for each comparison cycle, CLKi clock signals are generated such that only one CLKi signal switches from a logical low level to a logical high level in each comparison clock cycle. For example, CLK1 switches from a logical low level to a logical high level at point t3, CLK2 at point t4, CLK3 at point t5, and CLK4 at point t6. At the falling edge of each of CLKi at point t8, all capacitors are reconnected to $V_{REF}P$ to end the process of converting the analog input voltage into a 4-bit digital output.

Window signals Window_1 through Window_4 (i.e., Window_i, where i=1:4) are used for selecting an appropriate version of comparator output $V_{COMP}$ to be provided to the DAC capacitor array as described above with reference to FIG. 3. Window signals can be generated by combining the asynchronous clock signals CLKs and CLKi such that the pulse width of a Window_i signal begins at a rising edge of clock signal CLKi-1 from the previous comparison cycle and ends at a rising edge of clock signal CLKi from the current comparison cycle. Because clock signal CLKi-1 does not exist for the first comparison cycle, CLKs signal is used as described in detail in the next paragraph. The pulse width of Window_i signals is set to select only the rising edge of the comparator output $V_{COMP}$ and not its falling edge. Accordingly, the pulse width of Window_i signals cannot be longer than one CLKc cycle (i.e., one comparison clock cycle) and the falling edge of Window_i signals should be before the falling edge of comparator output $V_{COMP}$.

Window_i signals can be generated by a combination of clock signals CLKi and CLKi-1. That is, a Window_i signal for the current comparison cycle can be generated by a combination of the clock signal CLKi from the current comparison cycle and the clock signal CLKi-1 of the previous comparison cycle. For example, Window_i is set to a logical high level at the rising edge of CLKi-1 and is set to a logical low level at the rising edge of CLKi. Accordingly, Window_2 is set to a logical high level between points t3 and t4, Window_3 between points t4 and t5, and Window_4 between points t5 and t6. The first window signal, Window_1, is different because CLK0 does not exist. To generate Window_1, a complementary signal of sampling clock signal CLKs is used instead of CLK0. Window_i is set to a logical high level between points t2 and t3. Window signals are generated such that only one Window_i signal is set to a logical high level at any time during the entire sampling clock cycle between points t1 and t8. In one embodiment, Window_i signal is set to a logical low level after a duration of time from a time point when the rising edge of CLKi signal occurs. For example, Window_2 is set to a logical low level at a time point after the duration of time from point t4 but before point t5.

Figure 6:
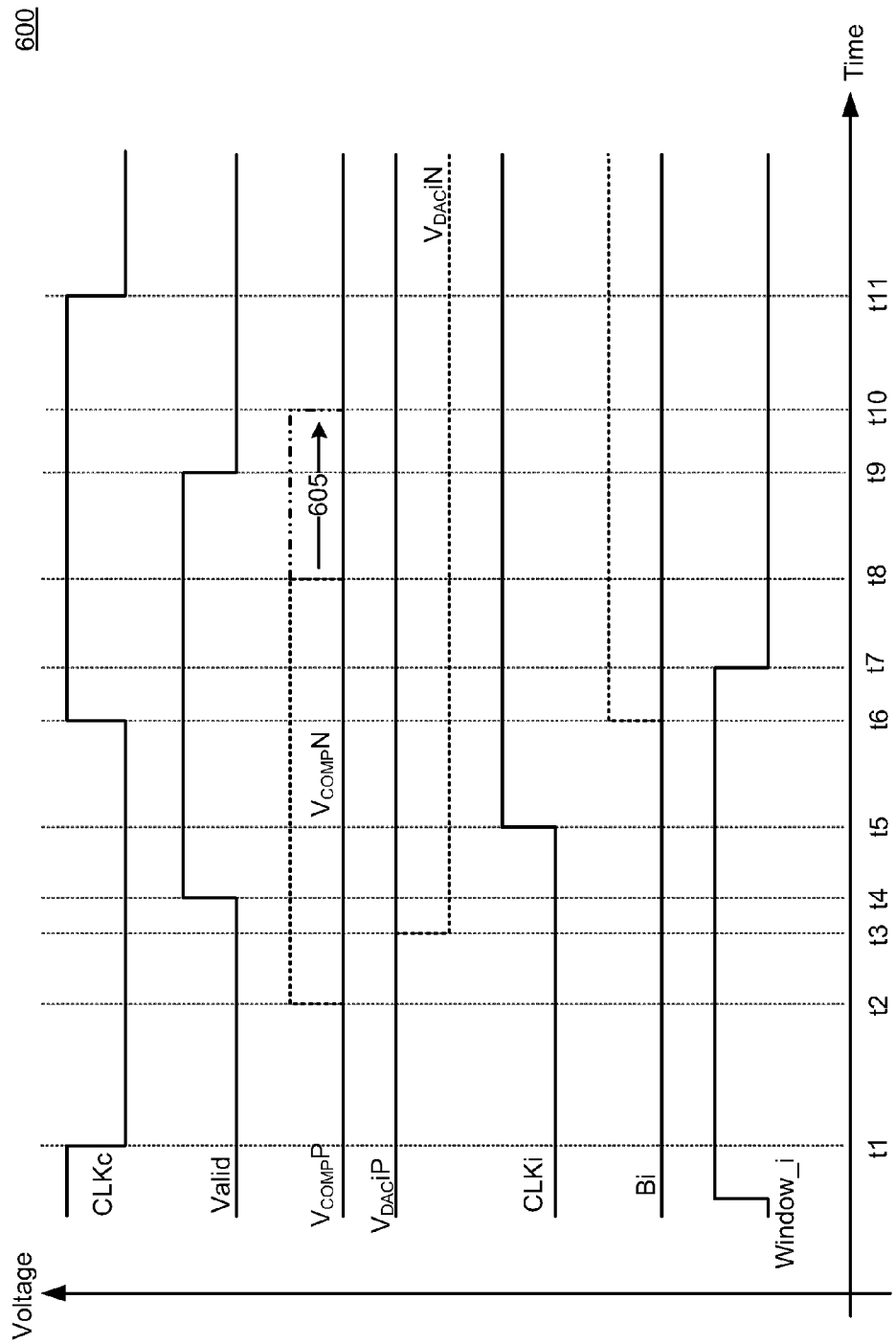
FIG. 6 is a timing diagram illustrating an embodiment of an SAR ADC to delay a falling edge of the comparator output.

FIG. 6 is a timing diagram illustrating an embodiment of an SAR ADC to delay a falling edge of the comparator output. FIG. 6 shows an operation of the SAR ADC that is similar to the operation described above with reference to FIG. 4 except for the difference that the falling edge of comparator output $V_{COMP}N$ is extended from point t8 to t10 as indicated by arrow 605. As discussed above with reference to FIGS. 4 and 5, Window_i's falling edge must occur between the rising edge of Bi at point t6 and the falling edge of comparator output $V_{COMP}N$ at point t8. As the SAR ADC sampling frequency increases, the time frame between points t6 and t8 becomes smaller. In such an exemplary scenario, increasing the time frame between the rising edge of Bi and the falling edge of comparator output $V_{COMP}N$ is advantageous, among other reasons, because the increased time frame provides additional time margin for the falling edge of Window_i signal before comparator output changes. For example, the falling edge of $V_{COMP}N$ can be delayed 605 from point t8 to t10 to increase the time frame between the rising edge of Bi and the falling edge of comparator output $V_{COMP}N$. An alternative embodiment to increase the time frame is described below with reference to FIG. 7.

Figure 7:
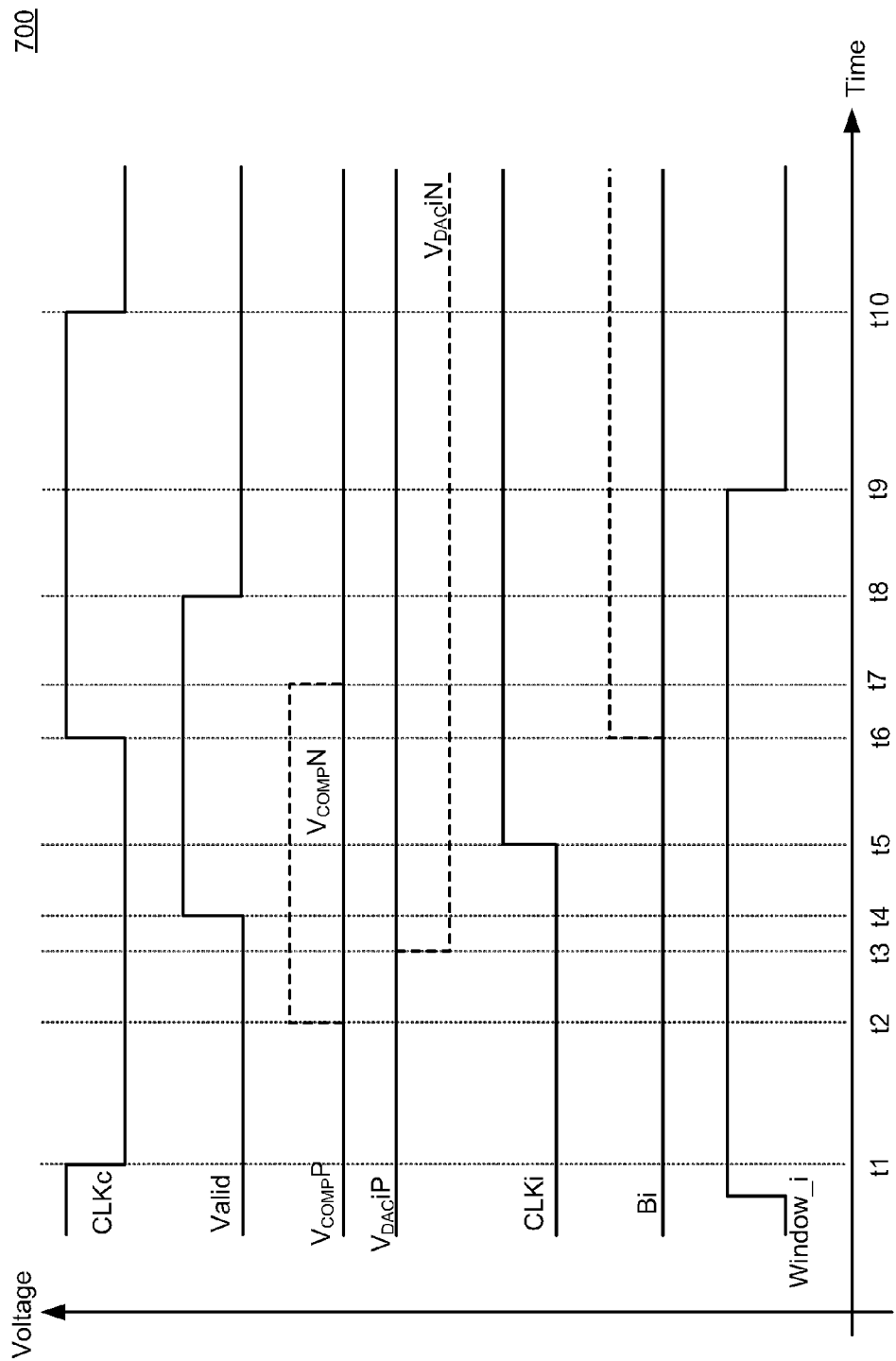
FIG. 7 is a timing diagram illustrating an embodiment of the SAR ADC, according to one embodiment.

FIG. 7 is a timing diagram illustrating an alternate embodiment of the SAR ADC to increase a time frame for the falling edge of Window_i pulse. FIG. 7 shows an operation of the SAR ADC that is similar to the operation described above with reference to FIG. 4 except for one difference. The DAC output signal $V_{DAC}iP/V_{DAC}iN$ is FIG. 7 is generated by a logical combination (e.g., logical OR) of comparator output $V_{COMP}$ at the output of TX gate1 and Bi to remove the condition on Window_i that the falling edge of Window_i signal must occur before the falling edge of comparator output $V_{COMP}$. For example, $V_{DAC}iP/V_{DAC}iN$ can be generated by a 2-input OR gate with the comparator output $V_{COMP}$ at the output of TX gate1 as the first input and signal Bi as the second input. Because this embodiment does not require the falling edge of Window_i to occur before the falling edge of $V_{COMP}$, the falling edge of Window_i can actually occur after the falling edge of $V_{COMP}$. For example, falling edge of Window_i occurs at point t9 after the falling edge of $V_{COMP}$ occurs at point t7. The falling edge of $V_{COMP}$ at point t7 triggers Valid signal to reach a logical low level at point t8.

Figure 8:
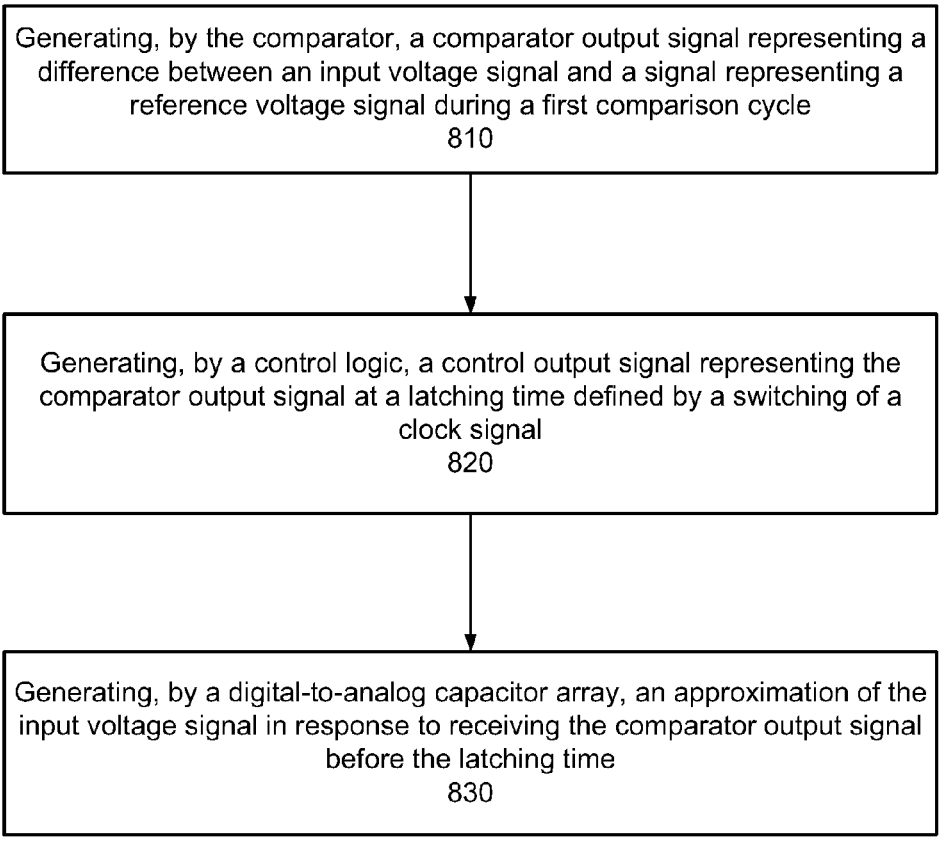
FIG. 8 is a flowchart illustrating an operation of an SAR ADC, according to one embodiment.

FIG. 8 is a flowchart illustrating an operation of an N-bit SAR ADC, according to one embodiment. The SAR ADC receives an analog input voltage $V_{IN}$ and a reference voltage signal $V_{REF}$ as inputs to generate a digital bit word as an output that is a digital approximation of the $V_{IN}$. The analog to digital conversion of $V_{IN}$ for the N-bit SAR ADC takes N comparison cycles as described above with reference to FIGS. 2 through 4. FIG. 8's flow chart illustrates the operation of the SAR ADC for the first of the N comparison cycles.

A comparator (e.g., comparator 120) of the SAR ADC generates 810 a comparator output signal (i.e., $V_{COMP}$) representing a difference between input voltage signal $V_{IN}$ and a signal representing reference voltage signal $V_{REF}$ during a first comparison cycle. The signal representing reference voltage signal $V_{REF}$ can be signal $V_{DAC}$ that is an analog approximation of the digital output Bi. $V_{DAC}$ can also be represented as an analog voltage value ranging between zero and $V_{REF}$ volts.

A control logic (e.g., control logic 310) of the SAR ADC generates 820 a control output signal (i.e., Bi) representing comparator output signal $V_{COMP}$ at a latching time defined by a switching of a clock signal (i.e., CLKi). Comparator output signal $V_{COMP}$ is also received by a window circuit (e.g., window 320) that can provide a version of the comparator output signal to a DAC (e.g., DAC 330) of the SAR ADC. The window circuit provides comparator output signal $V_{COMP}$ to the DAC at a time earlier than the latching time of comparator output signal $V_{COMP}$ by clock signal CLKi. After the comparator output is latched by the clock signal at the latching time (i.e., after a rising edge of signal Bi), the window circuit provides the latched version of the comparator output Bi to the DAC. In one embodiment, comparator output signal $V_{COMP}$ is provided from the comparator to the DAC before the comparator is reset during the comparison cycle.

Next, a DAC capacitor array (e.g., $C_{DAC}i$) of the DAC generates 830 an approximation of input voltage signal $V_{IN}$ (i.e., $V_{DAC}$) in response to receiving comparator output signal $V_{COMP}$ before the latching time. By beginning to receive comparator output signal $V_{COMP}$ at the DAC capacitor array before the latching time, the DAC capacitor array has a longer time frame of the sampling clock period (i.e., CLKs) for the settling of its capacitors compared to an implementation where the DAC capacitor array would receive comparator output signal $V_{COMP}$ only after the latching time. An increased time frame for the settling of the DAC capacitor array is useful as the sampling frequency of the SAR ADCs increases. After signal Bi is generated at the latching time, the DAC capacitor array continues to generate $V_{DAC}$ in response to receiving latched version of the comparator output signal Bi. This concludes the first comparison cycle.

Next, the $V_{DAC}$ signal generated in the first comparison cycle is fed back to the comparator for a comparison with the sampled $V_{IN}$ in the second comparison cycle. The operation of the SAR ADC in the second comparison cycle is the same as the first comparison cycle described above. The SAR ADC's operation as described in the first comparison cycle is repeated for N comparison cycles to finish the conversion of analog input voltage $V_{IN}$ into an N-bit digital approximation (i.e., Bi after N comparison cycles).

Figure 9:
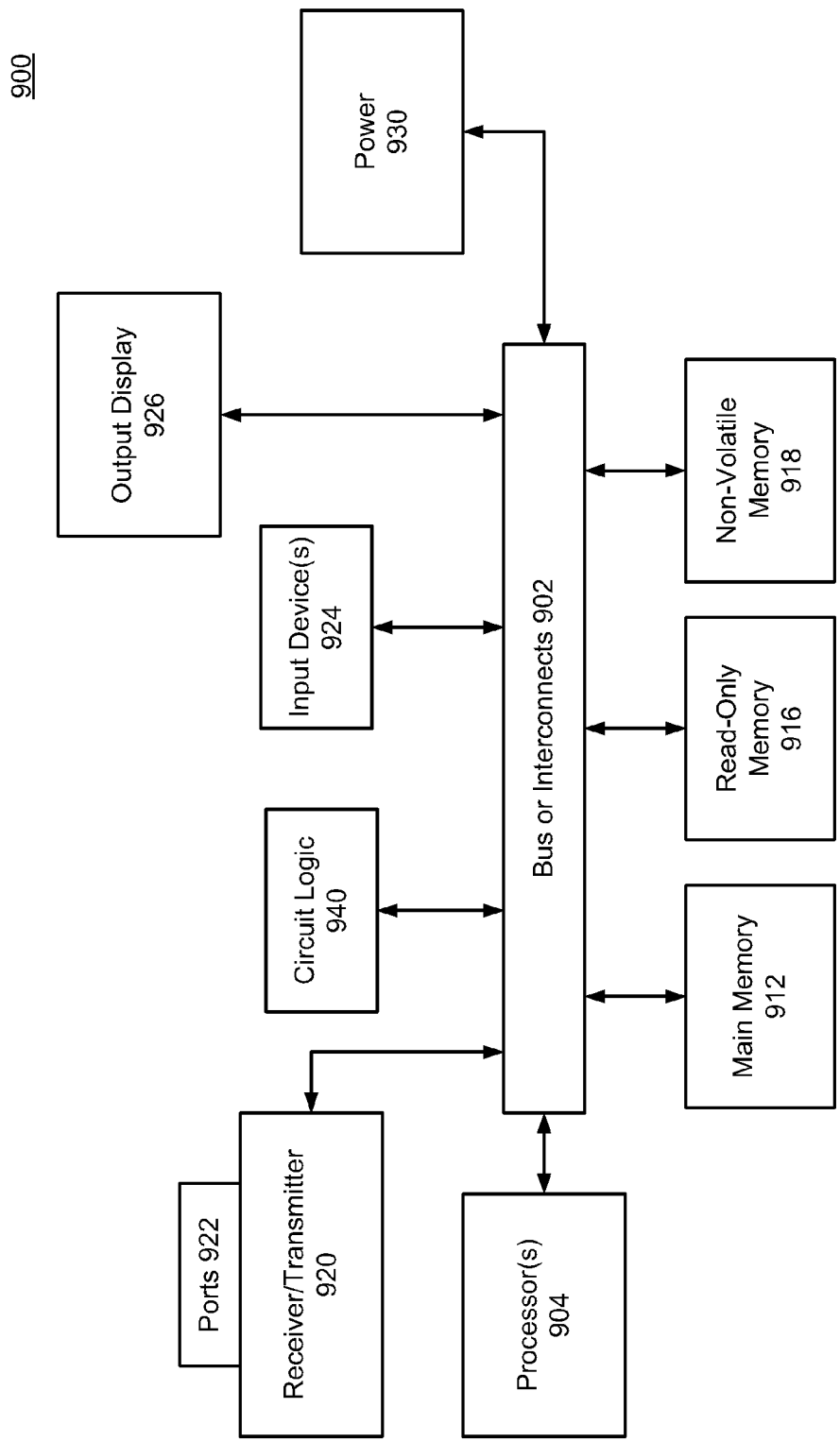
FIG. 9 is a block diagram illustrating an electronic device that stores a representation of an SAR ADC, according to one embodiment.

FIG. 9 is a block diagram of a special-purpose computing device that can store a representation of an SAR ADC, according to one embodiment. In one embodiment, a representation of an SAR ADC or components within the SAR ADC can be stored as data at in a non-transitory computer-readable medium (e.g., non-volatile memory 918). The representation can be at a behavioral level, register transfer level, logic component level, transistor level, and layout geometry-level of the SAR ADC.

In some embodiments, computer 900 comprises an interconnect or bus 902 (or other communication means) for transmission of data. Computer 900 can include a processing means such as one or more processors 904 coupled with bus 902 for processing information. Processors 904 can comprise one or more physical processors and/or one or more logical processors. While bus 902 is illustrated as a single interconnect for simplicity, it is understood that bus 902 can represent multiple different interconnects or buses. Bus 902 shown in FIG. 9 is an abstraction that represents any one or more separate physical buses, point to point connections, or both connected by appropriate bridges, adapters, controllers and/or the like.

In some embodiments, computer 900 further comprises a random access memory (RAM) or other dynamic storage device depicted as main memory 912 for storing information and instructions to be executed by processors 904. Main memory 912 can include an active storage of applications including a browser application for using in network browsing activities by a user of computer 900. Main memory 912 can further include certain registers or other special purpose memory.

Computer 900 can also comprise a read only memory (ROM) 916 or other static storage device for storing static information and instructions for processors 904. Computer 900 can further include one or more non-volatile memory elements 918 for the storage of certain elements, including, for example, flash memory, a hard disk, solid-state drive. Non-volatile memory elements 918 can store a representation of an SAR ADC described above with references to FIGS. 1 through 7, or components within the SAR ADC, can be stored as data. The representation can be at a behavioral level, register transfer level, logic component level, transistor level, and layout geometry-level of the SAR ADC.

Computer 900 can comprise transceiver module 920 that is coupled to bus 902. Transceiver module 920 can further comprise a transmitter module and a receiver module. Transceiver module 920 comprises one or more ports 922 to connect to other devices (not shown).

Computer 900 can also comprise circuit logic 940 coupled to bus 902 and configured to detect information from a second device (not shown) coupled through ports 922.

Computer 900 can also comprise output display 926 and coupled via bus 902. In some embodiments, display 926 can include a liquid crystal display (LCD) or any other display technology, for displaying information or content to a user, including three-dimensional (3D) displays. Alternatively, display 926 can include a touch screen that can also be part of input device 924. In some environments, display 926 can include an audio device, such as a speaker for providing audio information. Computer 900 can also comprise power device 930 that can comprise a power supply, a battery, a solar cell, a fuel cell, or other device for providing or generating power. Any power provided by power device 930 can be distributed as required to elements of computer 900.

While particular embodiments and applications of the present disclosure have been illustrated and described, it is to be understood that the embodiments are not limited to the precise construction and components disclosed herein and that various modifications, changes and variations may be made in the arrangement, operation and details of the method and apparatus of the present disclosure disclosed herein without departing from the spirit and scope of the disclosure as defined in the appended claims.

What is claimed is:

1. A successive-approximation register (SAR) based analog-to-digital converter (ADC) circuit comprising:
   a comparator comprising a first input for receiving an input voltage signal and a second input for receiving a signal representing a reference voltage signal, the comparator configured to generate a comparator output signal representing a difference between the input voltage signal and the reference signal during a first comparison cycle;
   a control logic comprising a first input coupled to the comparator to receive the comparator output signal and a second input for receiving a clock signal, the control logic configured to generate a control output signal representing the comparator output signal at a latching time defined by a switching of the clock signal; and
   a digital-to-analog converter (DAC) capacitor array coupled to the comparator, the DAC capacitor array configured to receive the comparator output signal from the comparator before the latching time to generate an approximation of the input voltage signal.

2. The circuit of claim 1, wherein the comparator output signal is provided from the comparator to the DAC capacitor array before the comparator is reset during the first comparison cycle.

3. The circuit of claim 1, further comprising a window circuit coupled between the control logic and the DAC capacitor array, the window circuit comprising a first transmission gate configured to provide the comparator output signal before the latching time to the DAC capacitor array and a second transmission gate configured to provide the comparator output signal after the latching time to the DAC capacitor array.

4. The circuit of claim 1, wherein the first comparison cycle is defined by a second clock signal different from the clock signal.

5. The circuit of claim 1, wherein the control logic further comprises a data valid circuit configured to generate a valid signal representing an active mode of the comparator.

6. The circuit of claim 1, wherein the control logic is further configured to generate a bit value of a digital approximation of the input voltage signal.

7. The circuit of claim 1, wherein the comparator is further configured to generate the comparator output signal, the control logic is further configured to generate the control output signal, and the DAC capacitor array is further configured to generate the approximation of the input voltage signal for N number of comparison cycles, where N is an integer greater than one.

8. The circuit of claim 7, wherein the control logic further comprises an asynchronous clock generator configured to generate N number of asynchronous clock signals used for latching of the comparator output signal, a first asynchronous clock signal of the N asynchronous clock signals is used for latching of the comparator output signal during the first comparison cycle, a second asynchronous clock signal of the N asynchronous clock signals is used for latching of the comparator output signal during the second comparison cycle, and an Nth asynchronous clock signal of the N asynchronous clock signals is used for latching of the comparator output signal during the Nth comparison cycle.

9. The circuit of claim 8, wherein the asynchronous clock generator is further configured to generate N number of window pulses used for providing the comparator output signal to the DAC capacitor array, a first window pulse of the N window pulses is used for providing the comparator output signal during the first comparison cycle, a second window pulse of the N window pulses is used for providing the comparator output signal during the second comparison cycle, and an Nth window pulse of the N window pulses is used for providing the comparator output signal during the Nth comparison cycle.

10. A method comprising:
generating, by a comparator, a comparator output signal representing a difference between an input voltage signal and a signal representing a reference voltage signal during a first comparison cycle;
generating, by a control logic, a control output signal representing the comparator output signal at a latching time defined by a switching of a clock signal; and
generating, by a digital-to-analog (DAC) capacitor array, an approximation of the input voltage signal in response to receiving the comparator output signal before the latching time.

11. The method of claim 10, wherein the approximation of the input voltage signal is generated in response to the DAC capacitor array receiving the comparator output signal from the comparator before the comparator is reset during the first comparison cycle.

12. The method of claim 10, wherein the approximation of the input voltage signal is generated in response to the DAC capacitor array receiving the comparator output signal from the comparator before the latching time and in response to the DAC capacitor array receiving the control output signal (Bi) after the latching time.

13. The method of claim 10, wherein the first comparison cycle is defined by a second clock signal different from the clock signal.

14. The method of claim 10, further comprising generating, by the control logic, a valid signal representing an active mode of the comparator.

15. The method of claim 10, further comprising generating, by the control logic, a bit value of a digital approximation of the input voltage signal.

16. The method of claim 10, wherein each of the comparator output signal, the control output signal, and the approximation of the input voltage signal are generated for N number of comparison cycles, where N is an integer greater than one.

17. The method of claim 10, further comprising generating, by the control logic, N number of asynchronous clock signals used for latching of the comparator output signal, a first asynchronous clock signal of the N asynchronous clock signals is used for latching of the comparator output signal during the first comparison cycle, a second asynchronous clock signal of the N asynchronous clock signals is used for latching of the comparator output signal during the second comparison cycle, and an Nth asynchronous clock signal of the N asynchronous clock signals is used for latching of the comparator output signal during the Nth comparison cycle.

18. The method of claim 10, further comprising generating, by the control logic, N number of window pulses used for providing the comparator output signal to the DAC capacitor array, a first window pulse of the N window pulses is used for providing the comparator output signal during the first comparison cycle, a second window pulse of the N window pulses is used for providing the comparator output signal during the second comparison cycle, and an Nth window pulse of the N window pulses is used for providing the comparator output signal during the Nth comparison cycle.

19. A non-transitory computer-readable medium storing a digital representation of a successive-approximation register (SAR) based analog-to-digital converter (ADC) circuit, comprising:

a comparator comprising a first input for receiving an input voltage signal and a second input for receiving a signal representing a reference voltage signal, the comparator configured to generate a comparator output signal representing a difference between the input voltage signal and the reference signal during a first comparison cycle;

a control logic comprising a first input coupled to the comparator to receive the comparator output signal and a second input for receiving a clock signal, the control logic configured to generate a control output signal representing the comparator output signal at a latching time defined by a switching of the clock signal; and a digital-to-analog converter (DAC) capacitor array coupled to the comparator, the DAC capacitor array configured to receive the comparator output signal from the comparator before the latching time to generate an approximation of the input voltage signal.

20. The computer-readable medium of claim 19, further comprising a window circuit coupled between the control logic and the DAC capacitor array, the window circuit comprising a first transmission gate configured to provide the comparator output signal before the latching time to the DAC capacitor array and a second transmission gate configured to provide the comparator output signal after the latching time to the DAC capacitor array.

* * * * *